(12) United States Patent
Zhang (10) Patent No.: US 11,979,005 B2
(45) Date of Patent: May 7, 2024

(54) MULTI-FAMILY METERING DEVICE WITH MODULAR METER COMPARTMENTS

(71) Applicant: Siemens Industry, Inc., Alpharetta, GA (US)

(72) Inventor: Fan Zhang, Suwanee, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 544 days.

(21) Appl. No.: 17/219,344

(22) Filed: Mar. 31, 2021

(65) Prior Publication Data
US 2022/0320834 A1 Oct. 6, 2022

(51) Int. Cl.
*H02B 1/04* (2006.01)
*G01R 22/06* (2006.01)

(52) U.S. Cl.
CPC ............. *H02B 1/04* (2013.01); *G01R 22/065* (2013.01)

(58) Field of Classification Search
CPC ...... G01R 22/00; G01R 22/06; G01R 22/061; G01R 22/063; G01R 22/065; G01R 22/08; G01R 22/10; H02B 11/00; H02B 1/04; H02B 1/041; H02B 1/043; H02B 1/044; H02B 1/052; H02B 1/06; H02B 1/066; H02B 1/20; H02B 1/202; H02B 1/26; H02B 1/30; H02B 1/308; H02B 1/40; H02B 1/46; H02B 1/44; Y04S 10/00; Y04S 10/12; Y04S 10/126; Y02T 90/167; B60S 5/00; B60L 53/63; B60L 53/665
USPC ......................................................... 200/293
See application file for complete search history.

(56) References Cited

U.S. PATENT DOCUMENTS

| 7,559,793 | B1 | 7/2009 | Zhang et al. | |
|---|---|---|---|---|
| 8,223,476 | B2 | 7/2012 | Zhang et al. | |
| 2014/0098470 | A1* | 4/2014 | Robinson | H02B 1/04 361/660 |
| 2016/0020584 | A1* | 1/2016 | Zhang | G01R 11/04 361/660 |

* cited by examiner

*Primary Examiner* — Anthony R Jimenez (57) ABSTRACT

A multi-family metering device including a plurality of modular meter compartments where the modular meter compartments are interconnected and laid out in a horizontal section. The multi-family metering device comprises a pull section having a first enclosure and a plurality of modular meter compartments for multiple service disconnects with an individual modular meter compartment provided for each service disconnect such that each modular meter compartment of the plurality of modular meter compartments having a second enclosure different from the first enclosure. One or more modular meter compartments of the plurality of modular meter compartments are configured to be attached to both or either side of the pull section. The second enclosures are joined together instead of providing one enclosure with a common wiring compartment that is divided into different sections.

20 Claims, 7 Drawing Sheets

MULTI-FAMILY METERING DEVICE WITH MODULAR METER COMPARTMENTS

BACKGROUND

1. Field

Aspects of the present invention generally relate to a multi-family metering device with modular meter compartments.

2. Description of the Related Art

Multiple service disconnects in a current design has service disconnects disposed in a common wiring compartment instead of being located in separate compartments. For multi-family metering where NEC 2020 code is adopted and enforced, customer can use an alternative system that includes a service equipment with a main disconnect and a modular meter stack.

Therefore, there is a need for a better multi-family metering device.

SUMMARY

Briefly described, aspects of the present invention relate to a multi-family metering device with modular meter compartments. The objective of the described invention is to provide an individual compartment for each service disconnect. This invention provides modular meter compartments that can be attached to both or either side of a pull section. The pull section and modular meter compartments have their own enclosures. The whole device has many enclosures joined together instead of one enclosure divided into different sections. A unique modular meter compartment layout and construction is presented.

In accordance with one illustrative embodiment of the present invention, a multi-family metering device comprises a pull section having a first enclosure and a plurality of modular meter compartments for multiple service disconnects with an individual modular meter compartment provided for each service disconnect such that each modular meter compartment of the plurality of modular meter compartments having a second enclosure different from the first enclosure. One or more modular meter compartments of the plurality of modular meter compartments are configured to be attached to both or either side of the pull section. The second enclosures are joined together instead of providing one enclosure with a common wiring compartment that is divided into different sections.

In accordance with one illustrative embodiment of the present invention, a method of enclosing a multi-family metering device is presented. The method comprises providing a pull section having a first enclosure and providing a plurality of modular meter compartments for multiple service disconnects with an individual modular meter compartment provided for each service disconnect such that each modular meter compartment of the plurality of modular meter compartments having a second enclosure different from the first enclosure. One or more modular meter compartments of the plurality of modular meter compartments are configured to be attached to both or either side of the pull section. The second enclosures are joined together instead of providing one enclosure with a common wiring compartment that is divided into different sections.

DETAILED DESCRIPTION

To facilitate an understanding of embodiments, principles, and features of the present invention, they are explained hereinafter with reference to implementation in illustrative embodiments. In particular, they are described in the context of a multi-family metering device with a pull section and modular meter compartments. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the multi-family metering device according to the present disclosure are described below with reference to FIGS. 1-7 herein. Like reference numerals used in the drawings identify similar or identical elements throughout the several views. The drawings are not necessarily drawn to scale.

Aspects of the present invention generally relate to modular meter compartments design for the multi-family metering device. Multiple service disconnects are disposed in separate compartments instead of being located in a common wiring compartment. For multi-family metering where NEC 2020 code is adopted and enforced, customer can use this system.

Figure 1:
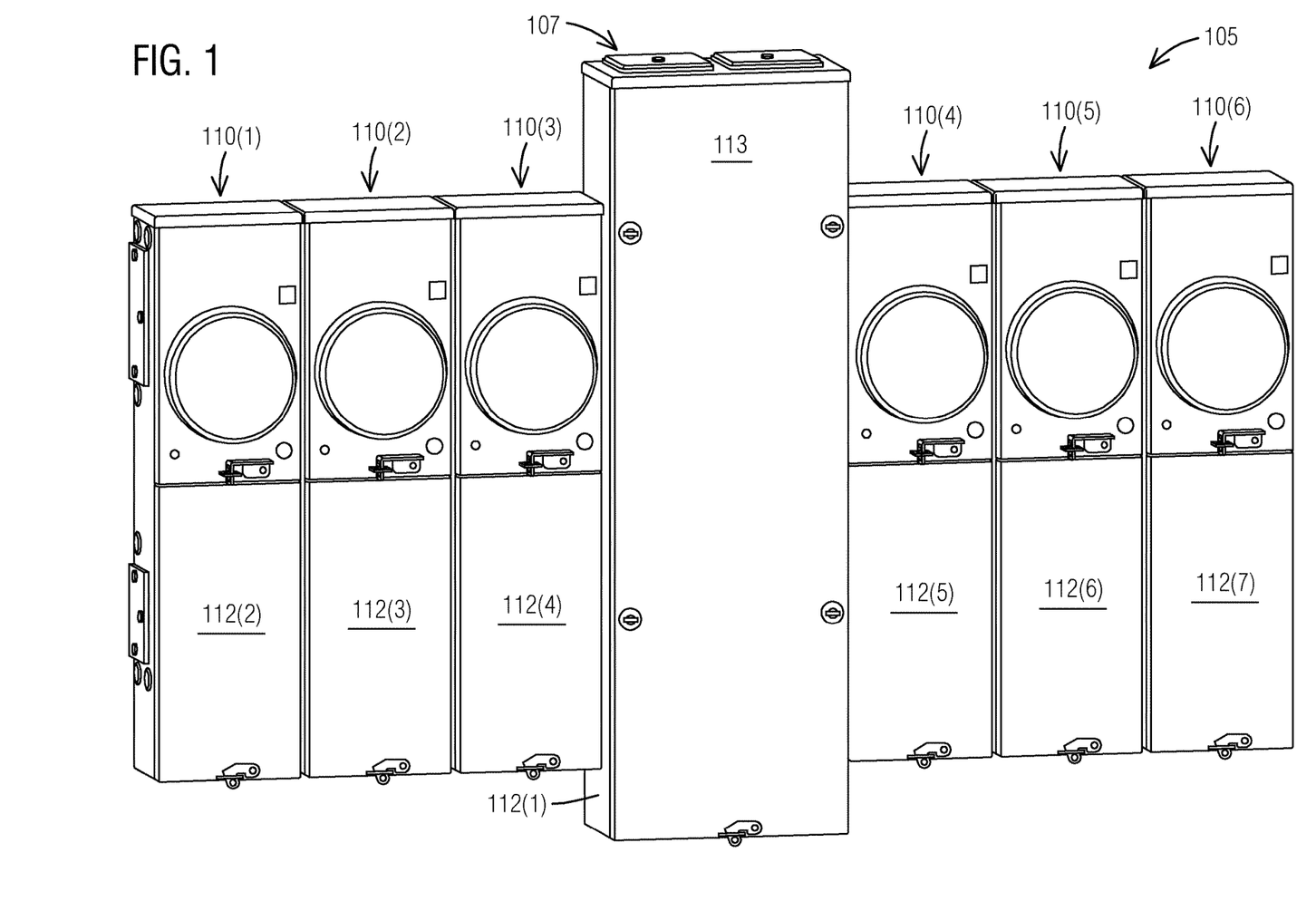
FIG. 1 illustrates a multi-family metering device with a pull section and modular meter compartments in accordance with an exemplary embodiment of the present invention.

Consistent with one embodiment of the present invention, FIG. 1 represents a block diagram of a multi-family metering device 105 in accordance with an exemplary embodiment of the present invention. FIG. 1 illustrates a multi-family metering device with a pull section and modular meter compartments in accordance with an exemplary embodiment of the present invention. Code NEC 2020 230.71 (B) requires service disconnects in metering centers where each service disconnect is located in a separate compartment. A prior art has the service disconnecting means (circuit breakers) laid out in one vertical section. The embodiment of this invention provides a design solution to adopt the code changes.

In FIG. 1, the multi-family metering device 105 comprises a pull section 107 and a plurality of (e.g., 2 to 6) modular meter compartments 110(1-6). The pull section 107 includes a first enclosure 112(1) and a sealable cover 113. The modular meter compartments 110(1-6) are interconnected and joined to both or either side of the pull section 107. The plurality of modular meter compartments 110(1-6) are for multiple service disconnects with an individual modular meter compartment provided for each service disconnect such that each modular meter compartment of the plurality of modular meter compartments 110(1-6) having a second enclosure 112(2-7) different from the first enclosure 112(1). One or more modular meter compartments of the plurality of modular meter compartments 110(1-6) are configured to be attached to both or either side of the pull section 107. The second enclosures 112(2-7) are joined together instead of providing one enclosure with a common wiring compartment that is divided into different sections.

In the multi-family metering device 105, the multiple service disconnects are circuit breakers. And the plurality of modular meter compartments 110(1-6) are interconnected and laid out in a horizontal fashion.

Figure 2:
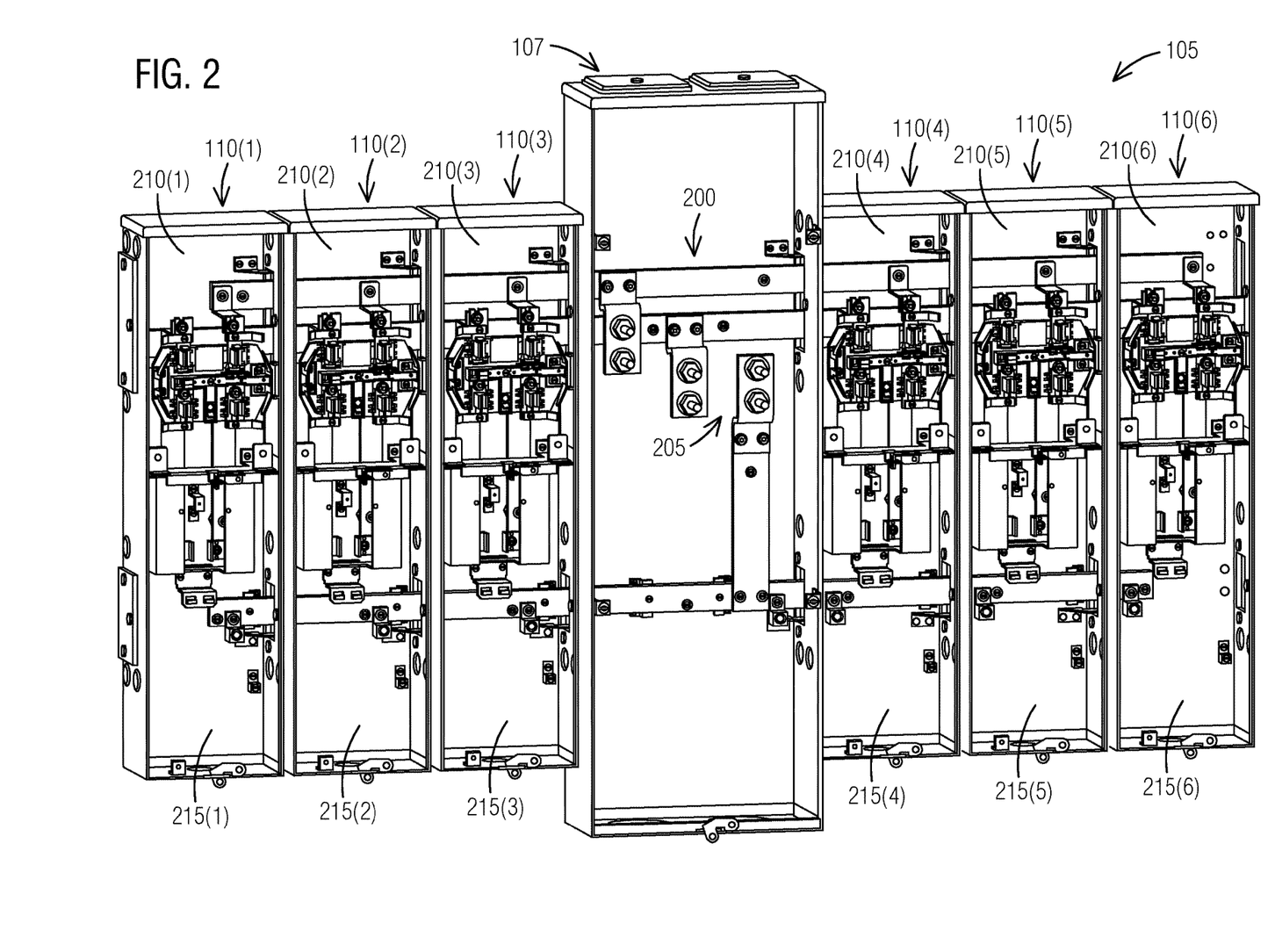
FIG. 2 illustrates inner structure of the multi-family metering device of FIG. 1 in accordance with an exemplary embodiment of the present invention.
Figure 3:
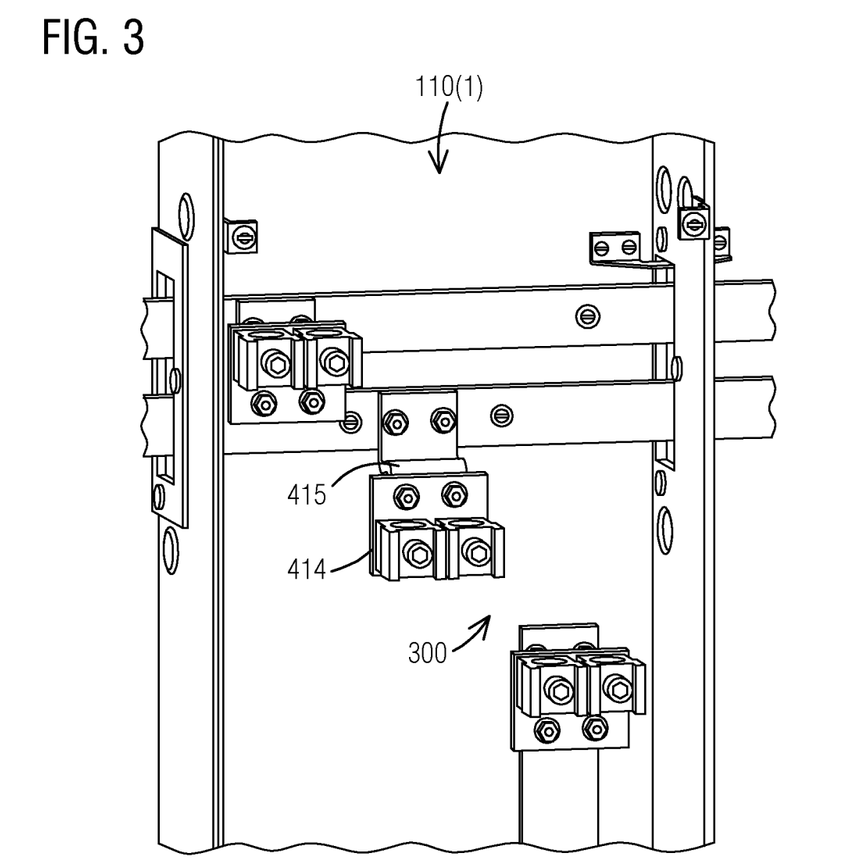
FIG. 3 illustrates an alternative line terminals design in accordance with an exemplary embodiment of the present invention.

Referring to FIG. 2, it illustrates an inner structure 200 of the multi-family metering device 105 of FIG. 1 in accordance with an exemplary embodiment of the present invention. The pull section 107 has line terminals 205 that receive a feed wire from a utility power source. The line terminals 205 can either be a stud type as shown in FIG. 2 or lay-in connectors 300 as shown in FIG. 3. The multi-family metering device 105 comprises meter sections 210(1-6) and circuit breaker sections 215(1-6).

Turning now to FIG. 3, it illustrates an alternative line terminals design in accordance with an exemplary embodiment of the present invention. The alternative line terminals design includes lay-in connectors 300. Lay-in connectors offer the ultimate in flexibility. And they are excellent for grounding and continuous loop applications. The lay-in connectors are mounted on a bus plate 414 and the bus plate 414 is seating on to a Z shaped bus 415.

Figure 4:
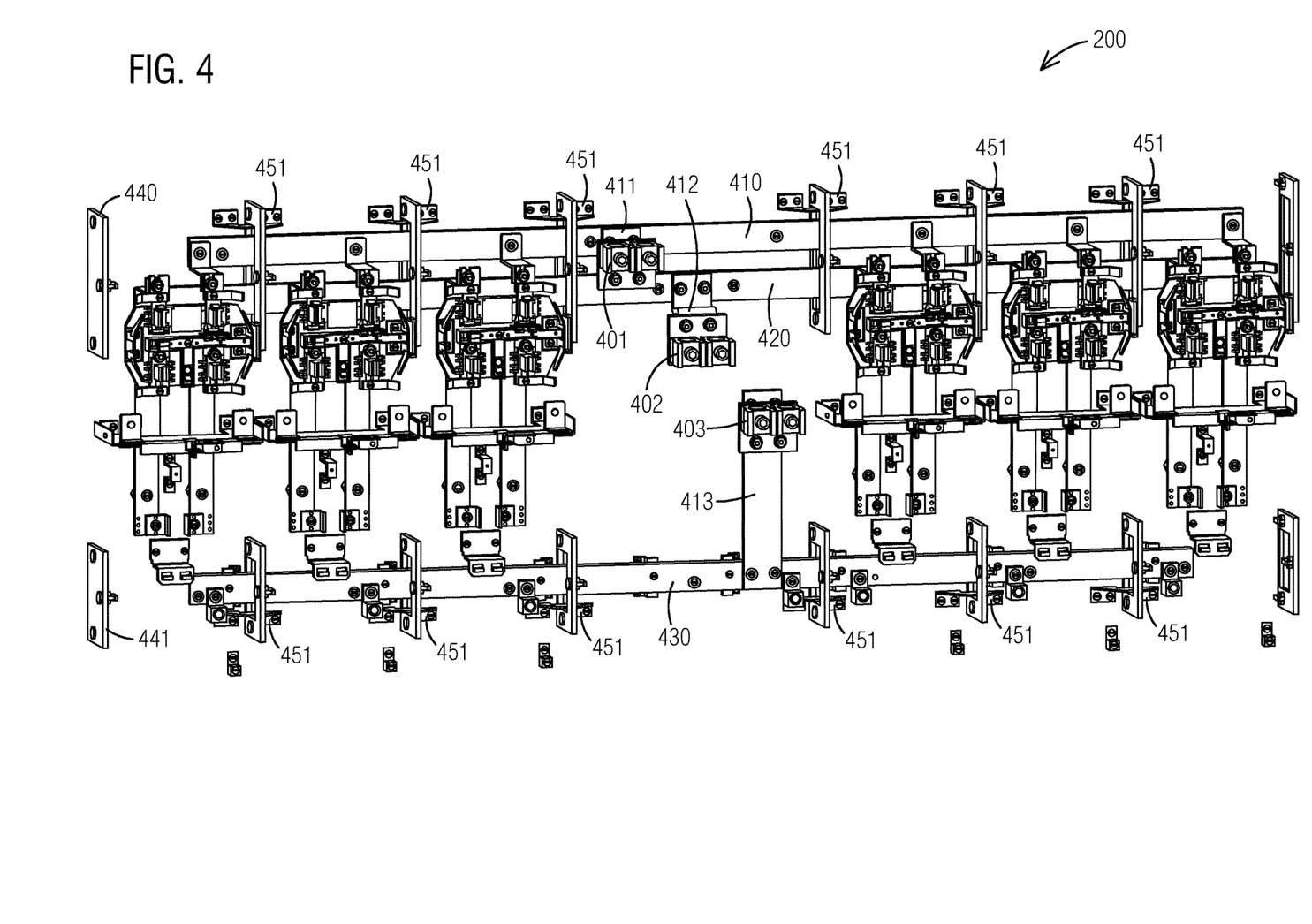
FIG. 4 illustrates interior construction of the multi-family metering device of FIG. 2 in accordance with an exemplary embodiment of the present invention.

FIG. 4 illustrates interior construction or the inner structure 200 of the multi-family metering device 105 of FIG. 2 with all enclosures and covers removed in accordance with an exemplary embodiment of the present invention. There are two horizontal buses 410 and 420 crossing through all meter sections 210(1-6) (see FIG. 2) that distribute the phase power to each modular meter compartment. A neutral bus 430 is laid below the two horizontal buses 410 and 420 that crosses through all circuit breaker sections 215(1-6) (see FIG. 2). The neutral bus 430 connects neutral lugs and ground connects of all modular meter compartments to a neutral line. Inside the pull section 107, the line terminals 401, 402, 403 are connected through riser buses 411, 412, 413 (as fastened by bolts and nuts) to the phase buses 410, 420 and the neutral bus 430 respectively. The terminal 401 has one or more lay-in connectors. The lay-in connectors are mounted on the bus plate 414 (see FIG. 3) and the bus plate 414 is seating on to a Z shaped bus 415 (see FIG. 3) that is connected to the phase bus 410. Line terminals 402 and 403 are connected in the same fashion.

The two horizontal phase buses 410 and 420 cross through all meter sections 210(1-6) to distribute a phase power to each modular meter compartment of the plurality of modular meter compartments 110(1-6). The neutral bus 430 is laid below the two horizontal phase buses 410 and 420 and it crosses through a circuit breaker section 215(1) (see FIG. 2) such that the neutral bus 430 connects neutral lugs and ground connects of all modular meter compartments of the plurality of modular meter compartments 110(1-6) to a neutral line. Brackets 451 are mounted and metal plates 440 and 441 are capped in the multi-family metering device 105. (see FIG. 5)

Figure 5:
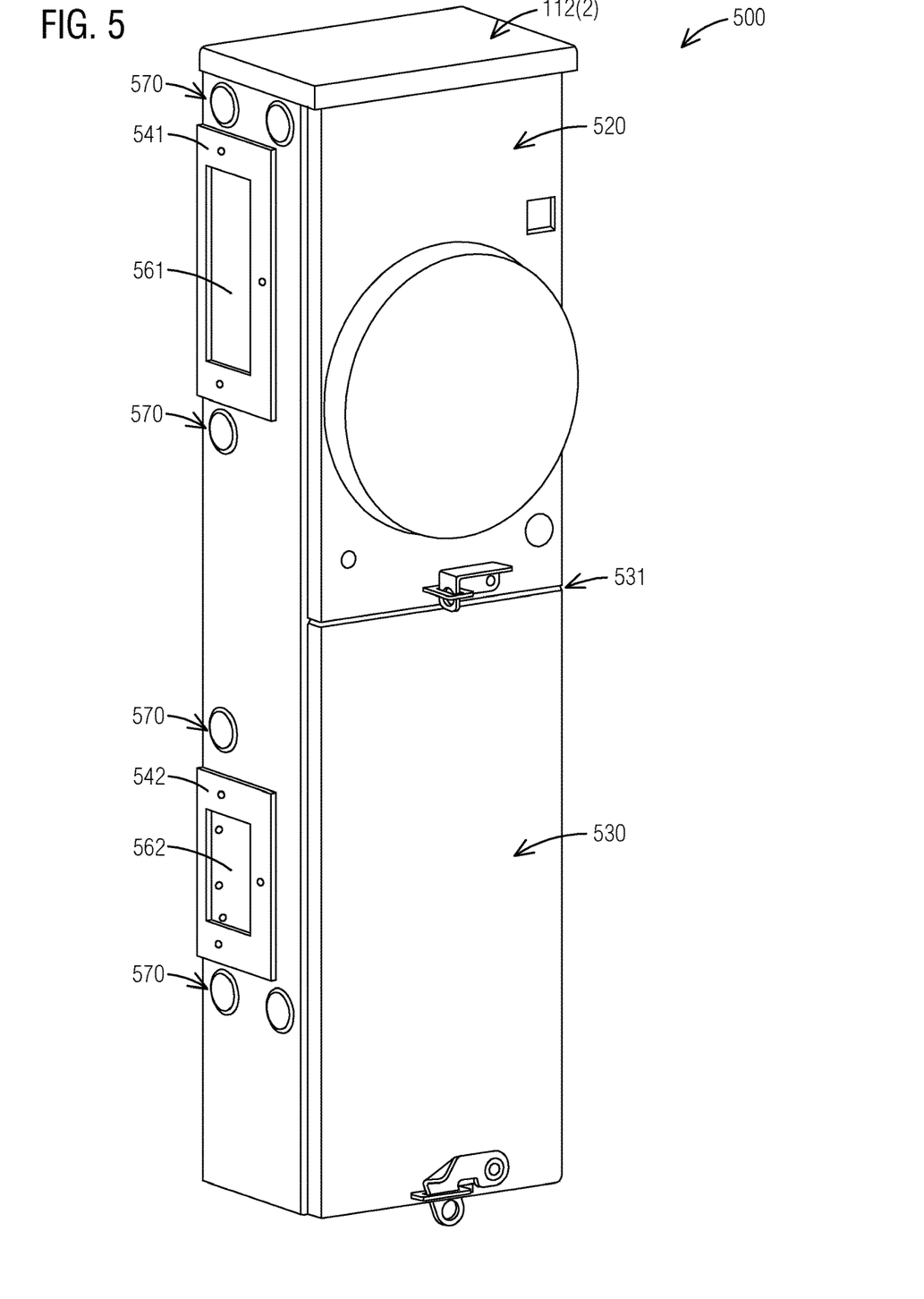
FIG. 5 illustrates a modular meter compartment in accordance with an exemplary embodiment of the present invention.

As seen in FIG. 5, it illustrates a modular meter compartment 500 in accordance with an exemplary embodiment of the present invention. The modular meter compartment 500 comprises two gaskets 541, 542 on each side of the second enclosure 112(2) around a top trough 561 where the two phase buses 410 and 420 are crossing and a bottom trough 562 where the neutral bus 430 is crossing. Multiple bolt and nuts are used around the top and bottom troughs 561, 562 to bond the enclosure together and compress the gaskets for rain proof purposes. Brackets 451 (see FIG. 4) are mounted on top and bottom troughs 561, 562 to reenforce the enclosure joints and ensure the continuity between the enclosures. Metal plates 440 and 441 (see FIG. 4) are capped on outside of the top and bottom troughs 561, 562.

The modular meter compartment 500 comprises the second enclosure 112(2), a sealable meter cover 520, a load center cover 530, and first and second gaskets 541 and 542 around top and bottom troughs 561, 562 respectively. The first and second gaskets 541, 542 disposed on each side of the second enclosure 112(2) respectively, wherein the first gasket 541 being disposed around the top trough 561 where the two horizontal phase buses 410, 420 are crossing and wherein the second gasket 542 being disposed around the bottom trough 562 where the neutral bus 430 is crossing. Multiple formed embosses 570 are formed on a side of the second enclosure 112(2) that are configured to mate with a next enclosure to maintain proper unified spacing. The spacing between the enclosures are the clearance for the covers 520, 530 to operate and to avoid the gaskets 541, 542 being over compressed. The meter cover 520 can be either ringless type meter cover (shown) or ring type meter cover. The ringless type meter cover has a sealable latch. The load center cover 530 encloses a circuit breaker section 215(1) (see FIG. 2) that serves as a service disconnect. The load center cover 530 has an overlap formation 531 on the top to insert under the sealable meter cover 520 and a return flange 575 (see FIG. 6) on a barrier 660 (see FIG. 6) to remain secure when the sealable meter cover 520 is removed.

Figure 6:
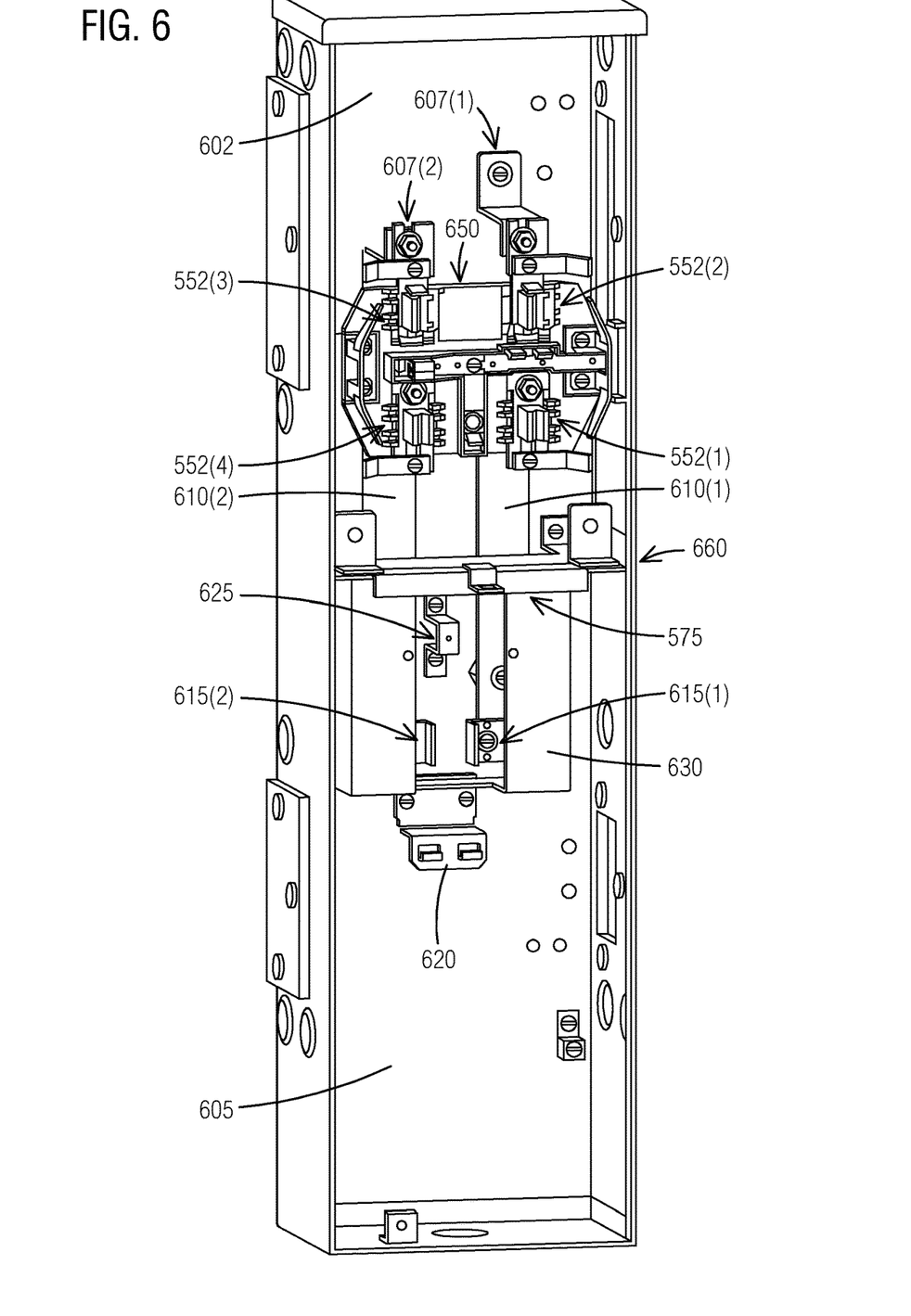
FIG. 6 illustrates interior details of the modular meter compartment of FIG. 5 in accordance with an exemplary embodiment of the present invention.

As shown in FIG. 6, it illustrates interior details of the modular meter compartment 500 of FIG. 5 in accordance with an exemplary embodiment of the present invention. A barrier 660 in the middle of the enclosure divides the enclosure into a meter section 602 and a circuit breaker section 605. A meter socket assembly 650 is installed in the meter section 602. The meter socket assembly 650 consists 4 meter jaws 552(1-4) that are each to receive an electrical watthour meter. Each meter jaw is mounted on its bus plate respectively. On the line side, Z shape formed buses 607(1) and 607(2) are configured to connect to two phase buses 410 and 420. On the load side, first and second buses 610(1) and 610(2) are linked from a meter socket to the circuit breaker section 605. At end of the buses 610(1) and 610(2), a plug stab 615(1), 615(2) is mounted by a screw for plugging in a circuit breaker, that serves as a service disconnect. A bridge 620 on bottom of the buses 610(1) and 610(2) provides landing and hooks for a circuit breaker, while a bracket 625 is extra support of a circuit breaker. A metal shield 630 is mounted around the buses 610(1) and 610(2) in the circuit breaker section 605. It shields the buses 610(1) and 610(2) and breaker stabs 615(1), 615(2) from exposure to avoid inadvertent contact.

Each modular meter compartment of the plurality of modular meter compartments 110(1-6) has the barrier 660 in middle of the second enclosure 112(2) that divides the second enclosure 112(2) into the meter section 602 and the circuit breaker section 605. Each modular meter compartment of the plurality of modular meter compartments 110 (1-6) has the sealable meter cover 520 that encloses the meter section 602 and the load center cover 530 that encloses the circuit breaker section 605 which serves as a service disconnect. Each modular meter compartment of the plurality of modular meter compartments 110(1-6) has the meter socket assembly 650 installed in the meter section 602 such that the meter socket assembly 650 consists of multiple meter jaws 552(1-4) that are each configured to receive an electrical watthour meter.

Figure 7:
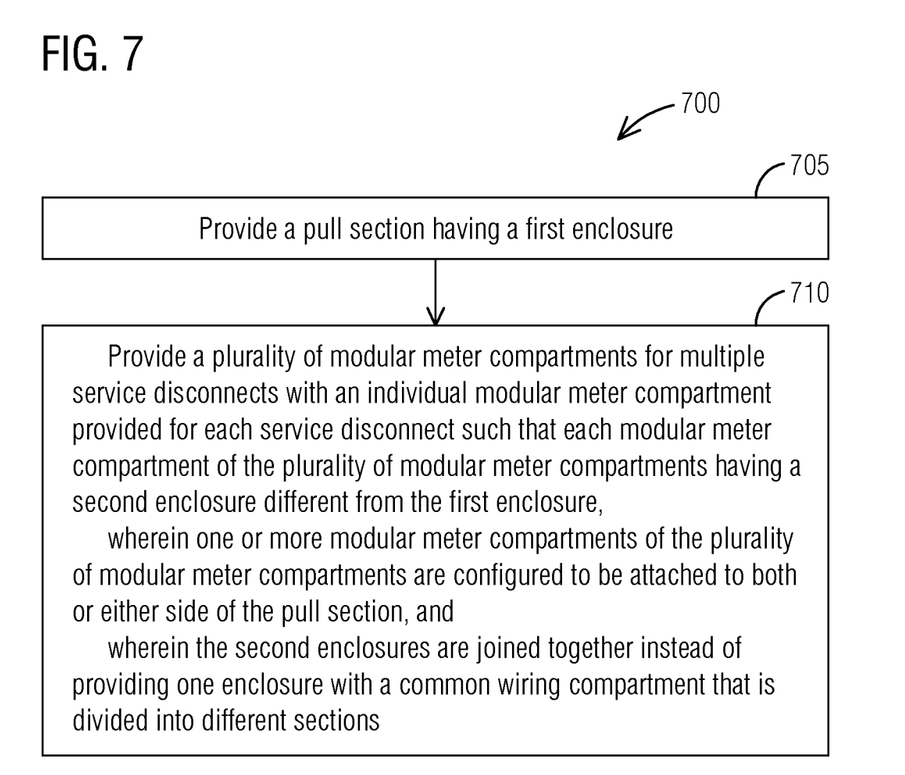
FIG. 7 illustrates a schematic view of a flow chart of a method of enclosing a multi-family metering device in accordance with an exemplary embodiment of the present invention.

In FIG. 7, it illustrates a schematic view of a flow chart of a method enclosing a multi-family metering device in accordance with an exemplary embodiment of the present invention. Reference is made to the elements and features described in FIGS. 1-6. It should be appreciated that some steps are not required to be performed in any particular order, and that some steps are optional.

The method 700 comprises a step 705 of providing a pull section having a first enclosure. The method 700 further comprises a step 710 of providing a plurality of modular meter compartments for multiple service disconnects with an individual modular meter compartment provided for each service disconnect such that each modular meter compartment of the plurality of modular meter compartments having a second enclosure different from the first enclosure. One or more modular meter compartments of the plurality of modular meter compartments are configured to be attached to both or either side of the pull section. The second enclosures are joined together instead of providing one enclosure with a common wiring compartment that is divided into different sections.

While a plurality of (e.g., 2 to 6) modular meter compartments are described here a range of one or more other number of compartments or other forms of compartments are also contemplated by the present invention. For example, other types of compartments may be implemented based on one or more features presented above without deviating from the spirit of the present invention.

The techniques described herein can be particularly useful for the plurality of modular meter compartments being interconnected and laid out in a horizontal section. While particular embodiments are described in terms of specific configuration of a layout, the techniques described herein are not limited to such a limited configuration but can also be used with other configurations and types of layouts.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A multi-family metering device, comprising:
a pull section having a first enclosure; and
a plurality of modular meter compartments for multiple service disconnects with an individual modular meter compartment provided for each service disconnect such that each modular meter compartment of the plurality of modular meter compartments has a second enclosure different from the first enclosure,
wherein one or more modular meter compartments of the plurality of modular meter compartments are configured to be attached to both or either side of the pull section, and
wherein each of the second enclosures are joined together instead of providing one enclosure with a common wiring compartment that is divided into different sections.

2. The multi-family metering device of claim 1, wherein the multiple service disconnects are circuit breakers.

3. The multi-family metering device of claim 1, wherein the pull section includes a sealable cover and the plurality of modular meter compartments are interconnected and laid out in a horizontal section.

4. The multi-family metering device of claim 3, wherein the pull section includes line terminals that receive a feed wire from a utility power source such that the line terminals can either be a stud type or lay-in connectors.

5. The multi-family metering device of claim 1, further comprising:
two horizontal phase buses that distribute a phase power to each modular meter compartment of the plurality of modular meter compartments.

6. The multi-family metering device of claim 5, further comprising:
a neutral bus laid below the two horizontal phase buses that crosses through a circuit breaker section such that the neutral bus connects neutral lugs and ground connects of all modular meter compartments of the plurality of modular meter compartments to a neutral line.

7. The multi-family metering device of claim 6, wherein inside the pull section line terminals are connected through a riser bus which is fastened by bolts and nuts to the two horizontal phase buses and the neutral bus, respectively.

8. The multi-family metering device of claim 7, wherein on a line side includes first and second Z shape formed buses that connect to first and second phase buses.

9. The multi-family metering device of claim 7, further comprising:
first and second gaskets disposed on each side of the second enclosure respectively, wherein the first gasket is disposed around a top trough where the two horizontal phase buses are crossing and wherein the second gasket is disposed around a bottom trough where the neutral bus is crossing.

10. The multi-family metering device of claim 1, wherein the second enclosure comprises:
multiple formed embosses on a side of the second enclosure that are configured to mate with a next enclosure to maintain proper unified spacing.

11. The multi-family metering device of claim 10, wherein on a load side includes first and second buses that are linked from a meter socket to a circuit breaker section.

12. The multi-family metering device of claim 10, wherein each modular meter compartment of the plurality of modular meter compartments has a barrier in a middle of the second enclosure that divides the second enclosure into a meter section and a circuit breaker section.

13. The multi-family metering device of claim 12, wherein each modular meter compartment of the plurality of modular meter compartments has a meter socket assembly installed in the meter section such that the meter socket assembly consists of multiple meter jaws that are each configured to receive an electrical watthour meter.

14. The multi-family metering device of claim 12, wherein each modular meter compartment of the plurality of modular meter compartments has a sealable meter cover that encloses the meter section and a load center cover that encloses the circuit breaker section which serves as a service disconnect.

15. The multi-family metering device of claim 14, wherein the load center cover includes an overlap formation on a top to insert under the sealable meter cover and a return flange on the barrier to remain secure when the sealable meter cover is removed.

16. A method of enclosing a multi-family metering device, the method comprising:
providing a pull section having a first enclosure; and
providing a plurality of modular meter compartments for multiple service disconnects with an individual modular meter compartment provided for each service disconnect such that each modular meter compartment of the plurality of modular meter compartments having has a second enclosure different from the first enclosure,
wherein one or more modular meter compartments of the plurality of modular meter compartments are configured to be attached to both or either side of the pull section, and
wherein the second enclosures are joined together instead of providing one enclosure with a common wiring compartment that is divided into different sections.

17. The method of claim 16, wherein the multiple service disconnects are circuit breakers.

18. The method of claim 16, wherein the pull section includes a sealable cover and the plurality of modular meter compartments are interconnected and laid out in a horizontal section.

19. The method of claim 16, wherein the pull section includes line terminals that receive a feed wire from a utility power source such that the line terminals can either be a stud type or lay-in connectors.

20. The method of claim 16, further comprising:
providing two horizontal phase buses crossing through all meter sections to distribute a phase power to each modular meter compartment of the plurality of modular meter compartments; and
providing a neutral bus laid below the two horizontal phase buses crosses through a circuit breaker section such that the neutral bus connects neutral lugs and ground connects of all modular meter compartments of the plurality of modular meter compartments to a neutral line.

* * * * *